（12）United States Patent
Yoshida et al.

(10) Patent No.: US 11,004,766 B2
(45) Date of Patent: May 11, 2021

(54) COOLER

(71) Applicant: TOYOTA JIDOSHA KABUSHIKI KAISHA, Toyota (JP)

(72) Inventors: Tadafumi Yoshida, Kasugai (JP); Ryo Miyazaki, Toyota (JP); Yasuki Hirota, Nagakute (JP); Takafumi Yamauchi, Nagakute (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 5 days.

(21) Appl. No.: 16/445,792

(22) Filed: Jun. 19, 2019

(65) Prior Publication Data

US 2019/0393128 A1 Dec. 26, 2019

(30) Foreign Application Priority Data

Jun. 25, 2018 (JP) ............................. JP2018-119946

(51) Int. Cl.
*H01L 23/367* (2006.01)
*H05K 7/20* (2006.01)

(52) U.S. Cl.
CPC .......... *H01L 23/3677* (2013.01); *H05K 7/20* (2013.01)

(58) Field of Classification Search
CPC .. H01L 23/3677; H05K 7/20; H05K 7/20254; F28F 3/12; F28F 3/048; F28D 2021/0028; F28D 1/40
See application file for complete search history.

(56) References Cited

U.S. PATENT DOCUMENTS

| 8,365,409 | B2* | 2/2013 | Kakiuchi | H01L 21/4878 29/890.053 |
| 2004/0244947 | A1* | 12/2004 | Chen | H01L 23/3672 165/80.3 |
| 2008/0149313 | A1* | 6/2008 | Slaughter | F28F 21/081 165/148 |
| 2009/0114372 | A1* | 5/2009 | Ippoushi | F28F 3/12 165/104.14 |
| 2012/0018128 | A1* | 1/2012 | Chang | F28D 15/0233 165/104.19 |
| 2012/0018130 | A1* | 1/2012 | Chang | F28D 15/0266 165/104.21 |
| 2012/0170222 | A1 | 7/2012 | Dede et al. | |

(Continued)

FOREIGN PATENT DOCUMENTS

JP 2004-311885 A 11/2004
JP 2012-142577 A 7/2012

(Continued)

*Primary Examiner* — Devon Russell
(74) *Attorney, Agent, or Firm* — Oliff PLC

(57) ABSTRACT

A cooler may include: a housing including a coolant space in which coolant flows; partition walls partitioning the coolant space into a plurality of flow channels; and a plurality of cooling fins located in each of the flow channels. The partition walls may be curved tortuously such that each of the flow channels comprises wide portions and narrow portions. The wide portions and the narrow portions may be arranged alternately in each of the flow channels in a direction along which the coolant flows. A number of the cooling fins located in each of the wide portions may be greater than a number of the cooling fins located in each of the narrow portions.

2 Claims, 5 Drawing Sheets

(56) References Cited

U.S. PATENT DOCUMENTS

| | | | | |
|---|---|---|---|---|
| 2013/0149169 A1* | 6/2013 | Campbell | ............... | F01D 5/187 |
| | | | | 416/97 R |
| 2017/0097196 A1* | 4/2017 | Yoo | ......................... | F28F 13/12 |
| 2017/0363375 A1* | 12/2017 | Mayor | ...................... | F28F 9/22 |
| 2019/0343019 A1* | 11/2019 | Todorovic | ............ | H05K 9/0015 |
| 2019/0385931 A1* | 12/2019 | Eid | ................... | H01L 23/49822 |

FOREIGN PATENT DOCUMENTS

| | | | | |
|---|---|---|---|---|
| JP | 2018-032744 A | 3/2018 | | |
| WO | WO-2017149208 A1 * | 9/2017 | .............. | F28F 13/12 |

\* cited by examiner

COOLER

TECHNICAL FIELD

The art disclosed in the description herein relates to a cooler.

BACKGROUND

A cooler described in JP 2018-032744 A is provided with a flat housing, and a coolant space where coolant flows is provided inside the housing. A plurality of pin fins is provided inside the coolant space. The pin fins are arranged by being distributed in the coolant space.

SUMMARY

In a cooler having a coolant space, cooling efficiency is improved by efficiently transmitting heat to coolant. Further, in the cooler having the coolant space, energy required for flowing the coolant is reduced by reducing pressure loss caused when the coolant flows. The description herein proposes a cooler with high cooling efficiency and low pressure loss.

A cooler described herein may comprise: a housing comprising a coolant space in which coolant flows; partition walls partitioning the coolant space into a plurality of flow channels; and a plurality of cooling fins located in each of the flow channels. The partition walls may be curved tortuously such that each of the flow channels comprises wide portions and narrow portions. The wide portions and the narrow portions may be arranged alternately in each of the flow channels in a direction along which the coolant flows. A number of the cooling fins located in each of the wide portions may be greater than a number of the cooling fins located in each of the narrow portions.

In this cooler, the wide portions and the narrow portions are arranged alternately in each flow channel in the direction along which the coolant flows. Further, the number of the cooling fins in each wide portion is greater than the number of the cooling fins in each narrow portion. Due to this, in each of the wide portions, the flow channel is partitioned into a plurality of small flow channels by the cooling fins. Generally, when coolant flows in a particular flow channel, a flow speed thereof becomes slower near walls of the flow channel than at a center of the flow channel due to friction. That is, boundary layers are generated in the coolant. Boundary layers are generated also when the coolant flows in the narrow portion. However, when the coolant flows into the wide portion from the narrow portion, the coolant flows by being partitioned into the small flow channels in the wide portion, by which the boundary layers that were generated in the narrow portion are thereby resolved. Further, boundary layers are generated respectively in the small flow channels in the wide portion while the coolant flows in those small flow channels. However, since flows of the coolant within the plurality of small flow channels merge upon when the coolant flows into the narrow portion from the wide portion, the boundary layers are thereby resolved. As above, in this cooler, the boundary layers are resolved each time the coolant flows over a predetermined distance. Due to this, the flow speed of the coolant near the partition walls and the cooling fins becomes relatively fast, and cooling efficiency of the cooler thereby improves. Further, since the number of the cooling fins in each wide portion is greater than the number of the cooling fins in each narrow portion, a cross-sectional area of those portions where the coolant flows (that is, an area that subtracted cross-sectional area of the cooling fins from a cross-sectional area of the flow channel) does not change so much between the wide portions and the narrow portions. Due to this, pressure loss is less likely to occur in each flow channel. As above, according to this cooler, high cooling efficiency and low pressure loss can be achieved.

Another cooler described herein may comprise: a housing comprising a coolant space in which coolant flows; and a plurality of cooling fins located in the coolant space. The coolant space may comprise a thickness direction, a flow direction perpendicular to the thickness direction and along which the coolant flows, and a width direction perpendicular to the thickness direction and the flow direction. In a view of the coolant space along the thickness direction, the coolant space may comprise cooling fin areas in each of which two or more of the cooling fins are provided close to each other and interval areas in each of which the cooling fins are not provided. In the view of the coolant space along the thickness direction, the cooling fin areas and the interval areas may be arranged alternately along the flow direction and may be arranged alternately along the width direction.

In this cooler, the boundary layers that were generated in the coolant are resolved when the coolant flows into the cooling fin areas from the interval areas and also when the coolant flows into the interval areas from the cooling fin areas. Thus, cooling efficiency of the cooler is thereby improved. Further, since the cooling fin areas and the interval areas are arranged alternately in the flow direction and are arranged alternately in the width direction as well, the cross-sectional area of those portions where the coolant flows (that is, the area that subtracted cross-sectional area of the cooling fins from the cross-sectional area of the flow channel) does not change so much among different positions along the flow direction. Due to this, pressure loss is less likely to occur in this cooler. As above, according to this cooler, high cooling efficiency and low pressure loss can be achieved.

Figure 1:
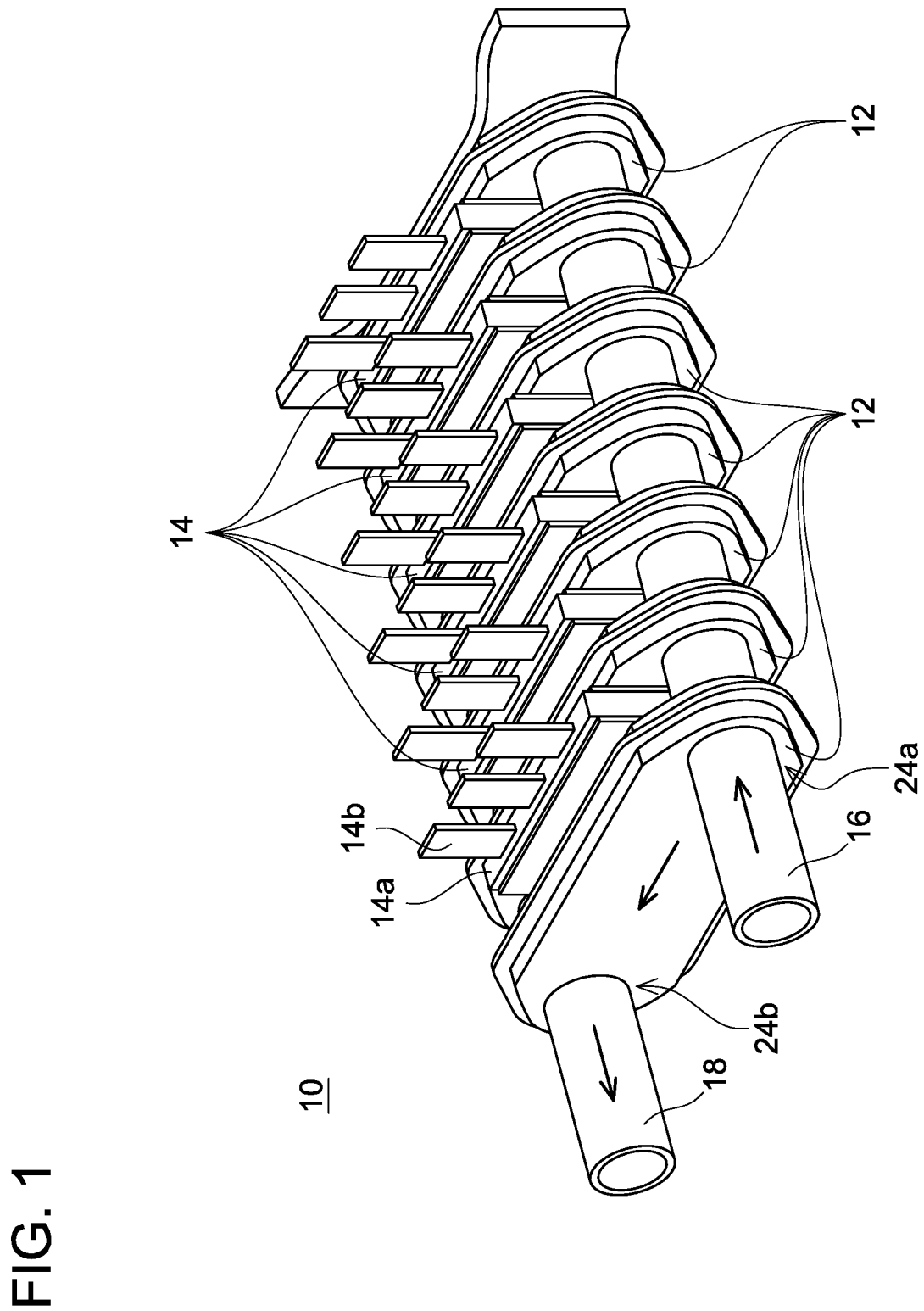
FIG. 1 is a perspective view of a power converter module 10.

DETAILED DESCRIPTION (First Embodiment) A power converter module 10 shown in FIG. 1 has a structure in which a plurality of coolers 12 and a plurality of semiconductor modules 14 are alternately stacked. Each of the semiconductor modules 14 includes a flat-shaped body portion 14a. The body portion 14a is constituted of resin, and has a switching element housed therein. A plurality of terminals 14b extend from a side surface of the body portion 14a. Each of the terminals 14b is connected to a wiring that is not shown. A power converter circuit (such as an inverter circuit, a DC-DC converter circuit, and the like) is configured by the plurality of semiconductor modules 14. One semiconductor module 14 is interposed between each pair of coolers 12.

Figure 2:
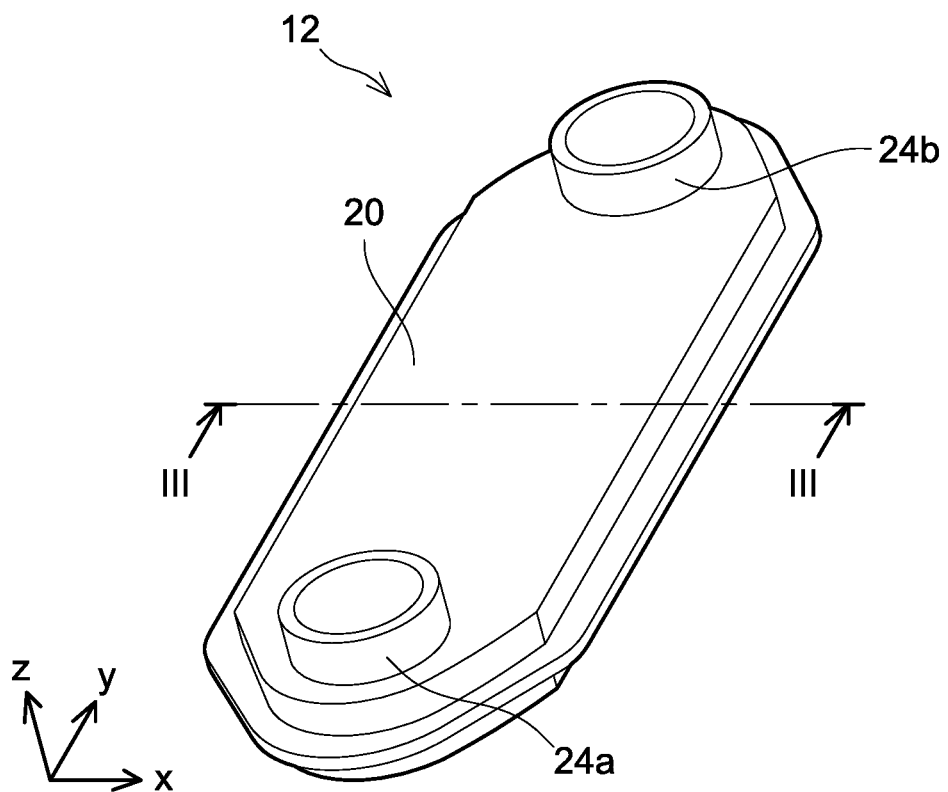
FIG. 2 is a perspective view of a cooler 12.
Figure 3:
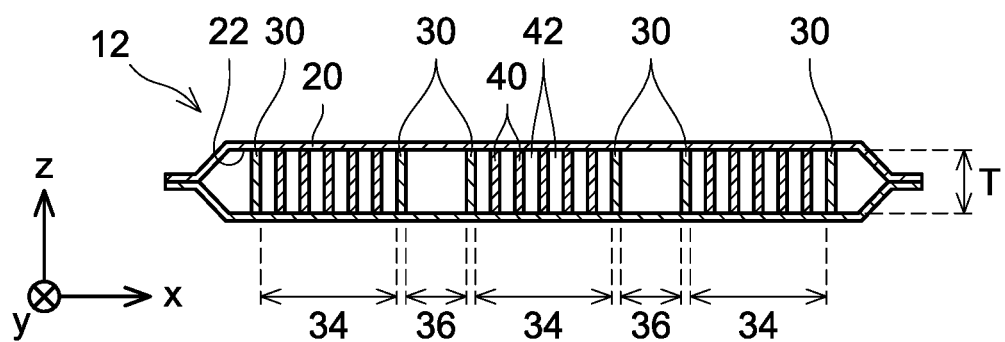
FIG. 3 is a cross-sectional view of the cooler 12 along a line III-III in FIG. 2.

As shown in FIG. 2, each of the coolers 12 has a flat shape. As shown in FIG. 3, each of the coolers 12 includes a housing 20 and a coolant space 22 provided inside the housing 20. As shown in FIG. 2, connection holes 24a, 24b are provided at longitudinal ends of each cooler 12. As shown in FIG. 1, a coolant supply pipe 16 is communicated with the connection holes 24a of the respective coolers 12, and a coolant discharge pipe 18 is communicated with the connection holes 24b of the respective cooers 12. The coolant supply pipe 16 and the coolant discharge pipe 18 are connected to a pump that is not shown. When the pump is driven, coolant (which is cooling water in this embodiment) flows from the coolant supply pipe 16 to the coolant discharge pipe 18 through the coolant spaces 22 inside the respective coolers 12 as indicated by arrows in FIG. 1. When the coolant flows within the coolers 12, heat generated in the semiconductor modules 14 is absorbed by the coolant, and the semiconductor modules 14 are thereby cooled. In the following description, as shown in FIGS. 2 and 3, a thickness direction of the coolers 12 will be termed a z direction, a longitudinal direction of the coolers 12 (direction along which the coolant flows) will be termed a y direction, and a width direction of the coolers 12 (direction perpendicular to the y and z directions) will be termed a x direction.

Figure 4:
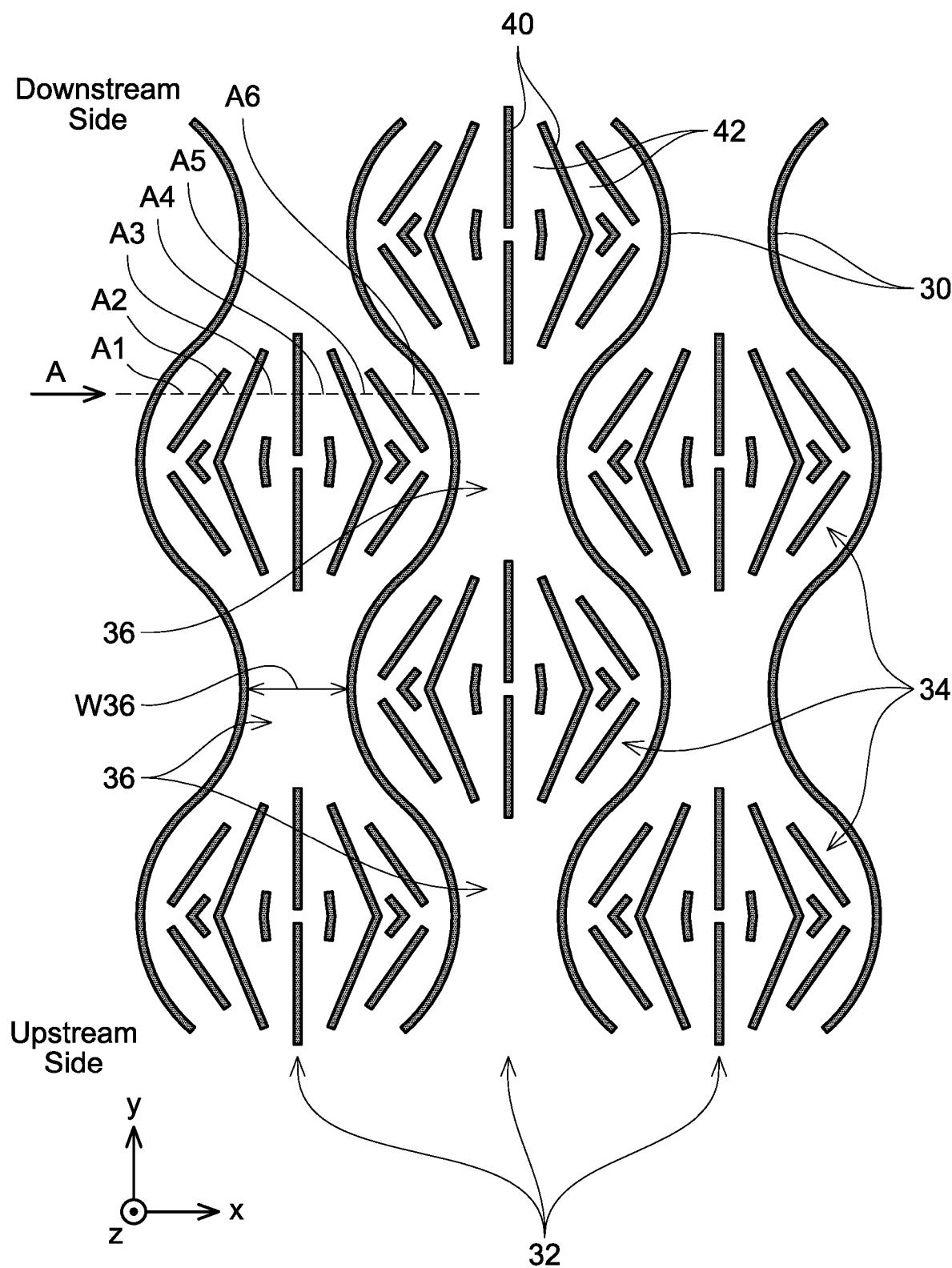
FIG. 4 is a plan view showing a structure in a coolant space 22 when seen in a z direction.

FIG. 4 shows an internal structure of the coolant space 22 when seen in the z direction. As shown in FIG. 4, partition walls 30 and cooling fins 40 are provided in the coolant space 22. The partition walls 30 extend in the y direction and are curved tortuously. As shown in FIG. 3, both ends of each partition wall 30 in the z direction are connected to the housing 20. As such, as shown in FIG. 4, the partition walls 30 partition the coolant space 22 into a plurality of flow channels 32 extending in the y direction. Due to the partition walls 30 being curved tortuously, each of the flow channels 32 is provided with wide portions 34 and narrow portions 36. In each of the flow channels 32, the wide portions 34 and the narrow portions 36 are arranged alternately in the y direction. Further, in the x direction, the wide portions 34 and the narrow portions 36 are arranged to be adjacent one another between adjacent flow channels 32. As such, the wide portions 34 and the narrow portions 36 are arranged alternately in the x direction.

As shown in FIG. 4, the cooling fins 40 are arranged in the wide portions 34 but not in the narrow portions 36. A plurality of cooling fins 40 is arranged in each of the wide portions 34. Each cooling fin 40 extends substantially in the y direction. As shown in FIG. 3, both ends of each cooing fin 40 in the z direction are connected to the housing 20. As such, each of the wide portions 34 is partitioned in the x direction by the cooling fins 40, by which a plurality of small flow channels 42 is defined. Each of the small flow channels 42 extends substantially in the y direction. The cooling fins 40 are arranged within each wide portion 34 in a greater number at positions with wider flow channel 32 widths.

Next, a cross-sectional area of portions where the coolant flows (hereinbelow termed a substantial flow channel cross-sectional area) will be described. As aforementioned, since no cooling fin 40 is arranged in the narrow portions 36, the coolant flows over entireties of the narrow portions 36. As such, a product of a width W36 of the narrow portion 36 (see FIG. 4) and a thickness T of the coolant space 22 in the z direction (see FIG. 3) becomes a substantial flow channel cross-sectional area in each of the narrow portions 36. On the other hand, since the wide portions 34 have the cooling fins 40 arranged therein, the coolant flows in the wide portions 34 by circumventing the cooling fins 40. Thus, in each of the wide portions 34, an area that subtracted cross-sectional areas of the respective cooling fins 40 from a cross-sectional area of the wide portion 34 becomes a substantial flow channel cross-sectional area. In other words, in each of the wide portions 34, an area that added cross-sectional areas of the respective small flow channels 42 becomes the substantial flow channel cross-sectional area. For example, at a position A in FIG. 4, a product of a value which is a total of widths of small flow channels A1, A2, A3, A4, A5, A6 and the thickness T becomes the substantial flow channel cross-sectional area. Since the cooling fins 40 are arranged in the wide portions 34 but not in the narrow portions 36, a difference between the substantial flow channel cross-sectional area in the wide portions 34 and the substantial flow channel cross-sectional area in the narrow portions 36 is not so large.

Next, a flow of the coolant in each of the flow channels 32 will be described. When the pump is driven as aforementioned, the coolant flows in each of the flow channels 32 from an upstream side (coolant supply pipe 16 side) toward a downstream side (coolant discharge pipe 18 side). The coolant flows to pass through the wide portions 34 and the narrow portions 36 alternately. When the coolant flows in the narrow portion 36, the flow of the coolant slows down in vicinities of the partition walls 30, by which boundary layers are formed in the vicinities of the partition walls 30. After this, when the coolant flows from the narrow portion 36 to the wide portion 34, the flow of the coolant is branched to the respective small flow channels 42. As above, when the flow of the coolant is branched, the boundary layers formed in the narrow portion 36 is thereby resolved. Flow of the coolant slow down in vicinities of the partition walls 30 and the cooling fins 40 as the coolant flows in the respective small flow channels 42, and boundary layers are formed at such portions. After this, when the coolant flows from the wide portion 34 to the narrow portion 36, the flows of the coolant in the respective small flow channels 42 merge into one flow. When the flows of the coolant merge as above, the boundary layers that were generated in the respective small flow channels 42 are resolved. As such, in the coolers 12, the boundary layers are resolved upon when the coolant flows from the narrow portion 36 to the wide portion 34 and from the wide portion 34 to the narrow portion 36. As such, the coolant can be flown at a relatively fast flow speed in the vicinities of the partition walls 30 and the cooling fins 40, and the semiconductor modules 14 can be cooled efficiently.

Further, in the coolers 12, as aforementioned, the difference between the substantial flow channel cross-sectional area in the wide portions 34 and the substantial flow channel cross-sectional area in the narrow portions 36 is not so large because the cooling fins 40 are arranged in the wide portions 34 but not in the narrow portions 36. As above, since the substantial flow channel cross-sectional areas of the flow channels 32 do not change so much between the wide portions 34 and the narrow portions 36, pressure loss generated in the flow channels 32 is small. Due to this, the coolant can be flown in the coolers 12 at a low pressure, and consumption power of the pump for flowing the coolant can be reduced.

Further, in the coolers 12, since the wide portions 34 and the narrow portions 36 are configured by the partition walls 30 being curved tortuously, the partition walls 30 do not have a thick portion, by a portion where cooling efficiency is reduced by thick partition walls does not exist. Thus, a large surface area of the housing 20 can be used as a cooling surface.

Figure 5:
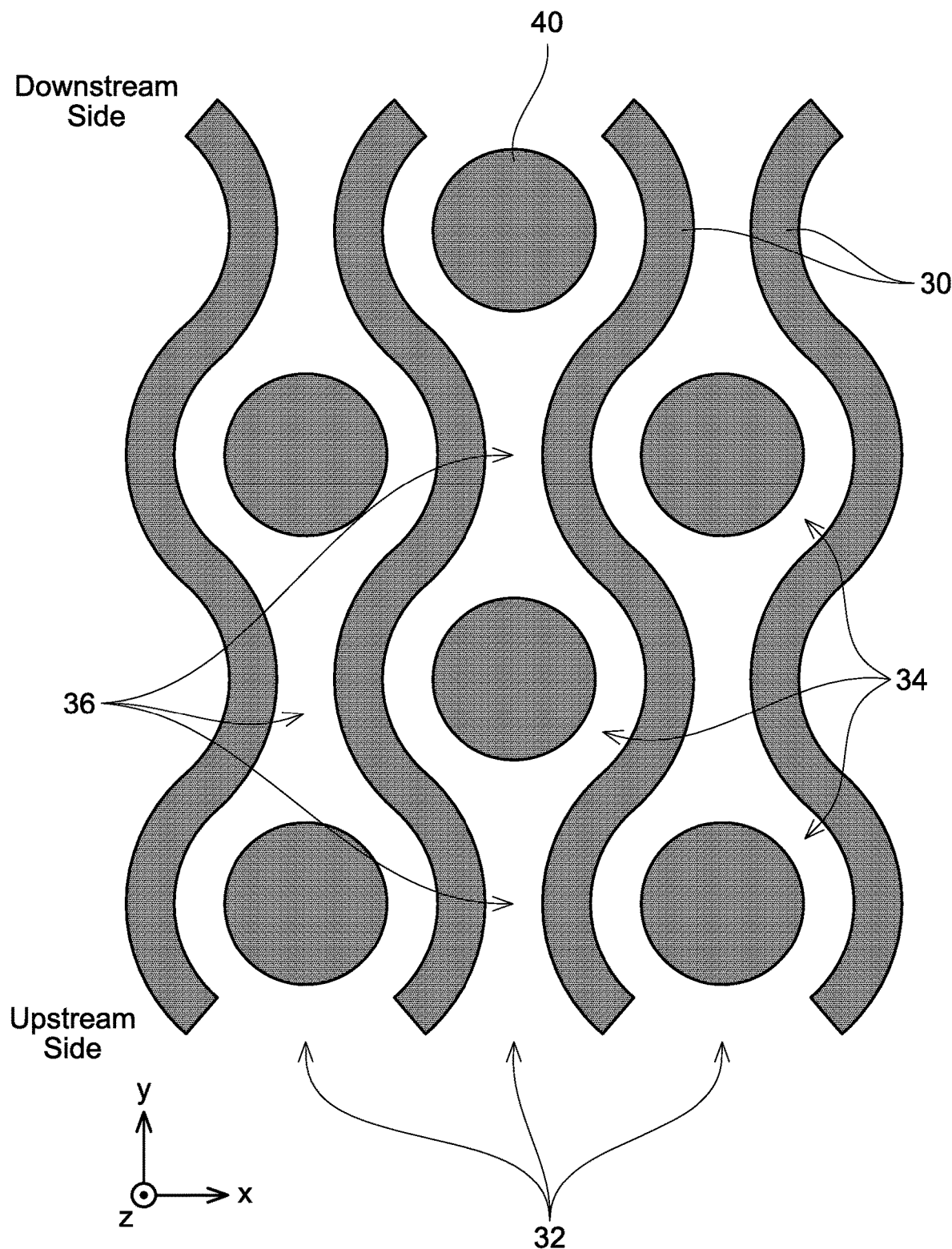
FIG. 5 is a plan view of a cooler according to a variant and corresponding to FIG. 4.

The cooling fins 40 were not arranged in the narrow portions 36 in the aforementioned first embodiment, however, the cooling fins 40 may be provided in the narrow portions 36 in a number smaller than that in the wide portions 34. Further, in a case where a Reynolds number is small, the boundary layers are less likely to occur, thus a smaller number of the cooling fins 40 can be provided in the wide portions 34. For example, as shown in FIG. 5, one large cooling fin 40 may be provided in each of the wide portions 34.

Figure 6:
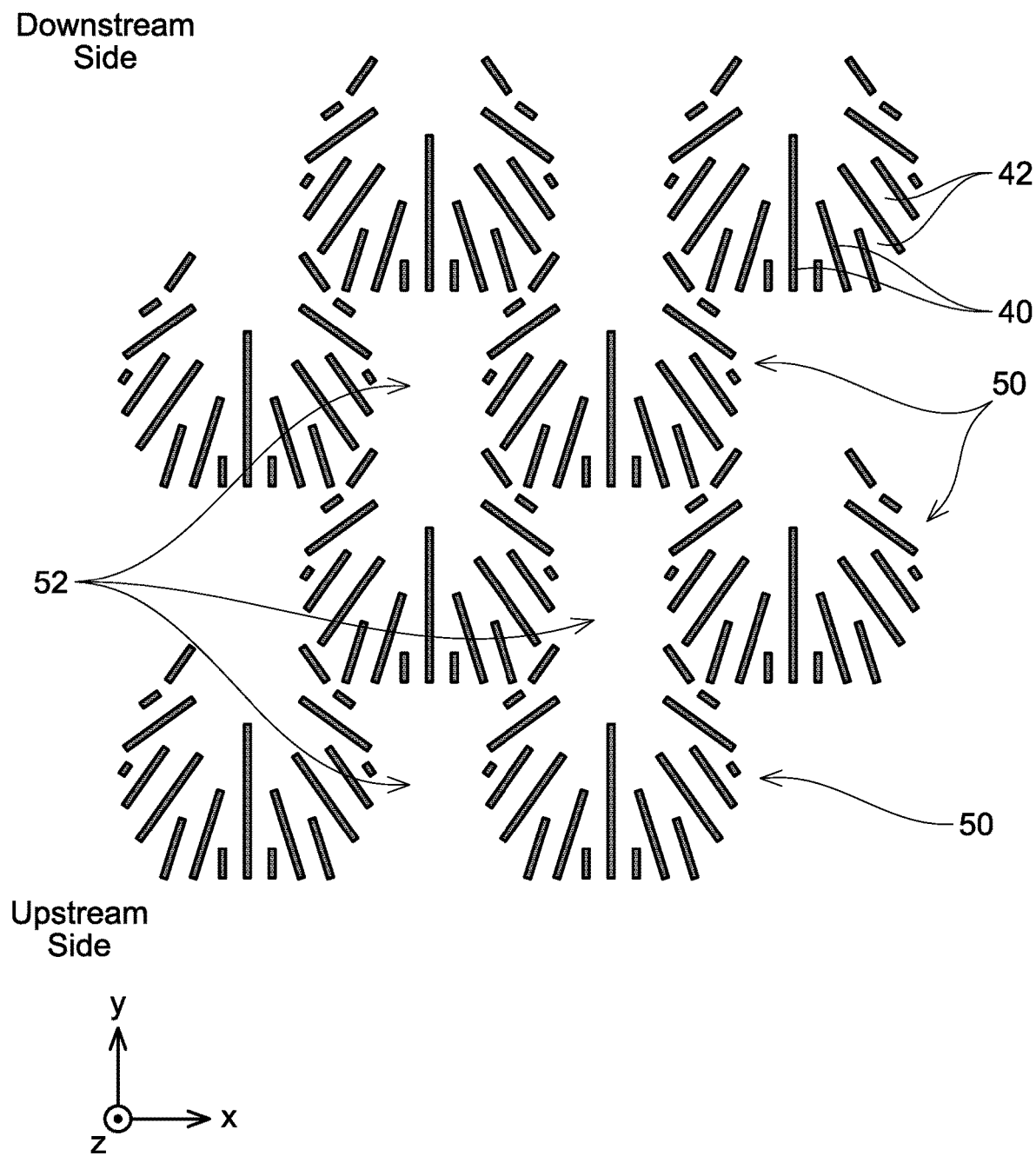
FIG. 6 is a plan view of a cooler according to a second embodiment and corresponding to FIG. 4.

(Second Embodiment) Next, a cooler according to a second embodiment will be described. The cooler according to the second embodiment is different from the first embodiment in regard to a structure of the coolant space 22. As shown in FIG. 6, the partition walls 30 are not provided in the coolant space 22 in the second embodiment. Further, in the second embodiment, the cooling fins 40 are arranged such that cooling fin areas 50 where a large number of the cooling fins 40 are densely provided and interval areas 52 where no cooling fins 40 are provided are arranged alternately when seen in the z direction. The cooling fin areas 50 and the interval areas 52 are arranged in a checkered pattern. That is, the cooling fin areas 50 and the interval areas 52 are arranged alternately in the y direction. Further, the cooling fin areas 50 and the interval areas 52 are arranged alternately in the x direction. The cooling fins 40 are arranged in each of the cooling fin areas 50 such that the cooling fins 40 extend toward a center of the cooling fin area 50 from the upstream side toward the downstream side.

Next, a flow of the coolant in the second embodiment will be described. In the second embodiment, the coolant flowing from the upstream side to the downstream side along the y direction flows alternately through the cooling fin areas 50 and the interval areas 52. The flow of the coolant is branched to the respective small flow channels 42 when the coolant flows from the interval areas 52 to the cooling fin areas 50. A flow speed of the coolant slows down in vicinities of the cooling fins 40 when the coolant flows through the respective small flow channels 42, and boundary layers are formed at such portions. After this, when the coolant flows from the cooling fin areas 50 to the interval areas 52, the flows of the coolant in the respective small flow channels 42 merge into one flow. When the flows of the coolant merge as above, the boundary layers that were generated in the respective small flow channels 42 are resolved. As such, in the coolers 12, the boundary layers are resolved upon when the coolant flows from the cooling fin areas 50 to the interval areas 52. As such, the coolant can be flown at a relatively fast flow speed in the vicinities of the cooling fins 40, and the semiconductor modules 14 can be cooled efficiently.

Further, the coolers according to the aforementioned first and second embodiments differ from impinging jet coolers in that they flow the coolant along their cooling surfaces. Due to this, entireties of the flow channels 32 are configured as flow channels for cooling, and as flow channels that convey the coolant. As such, a size of the coolers according to the aforementioned first and second embodiments can be reduced as compared to the impinging jet coolers.

In the first and second embodiments, the arrangements of the cooling fins 40 may be geometrically optimized by topological analysis.

While specific examples of the present invention have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

What is claimed is:

1. A cooler comprising:
   a housing comprising a coolant space in which coolant flows;
   partition walls partitioning the coolant space into a plurality of flow channels; and
   a plurality of cooling fins located in each of the flow channels,
   wherein
   the partition walls are curved tortuously such that each of the flow channels comprises wide portions and narrow portions,
   the wide portions and the narrow portions are arranged alternately in each of the flow channels in a direction along which the coolant flows,
   a number of the cooling fins located in each of the wide portions is greater than a number of the cooling fins located in each of the narrow portions, and
   a plurality of the cooling fins are located in each of the wide portions, and the plurality of the cooling fins are arranged within each of the wide portions in a greater number at first positions of the wide portions having wider flow channel widths than at second positions of the wide portions having narrower flow channel widths, with at least one of the cooling fins being arranged at the second positions.

2. A cooler comprising:
   a housing comprising a coolant space in which coolant flows; and
   a plurality of cooling fins located in the coolant space,
   wherein
   the coolant space comprises a thickness direction, a flow direction perpendicular to the thickness direction and along which the coolant flows, and a width direction perpendicular to the thickness direction and the flow direction,
   in a view of the coolant space along the thickness direction, the coolant space comprises cooling fin areas in each of which two or more of the cooling fins are provided close to each other and interval areas in each of which the cooling fins are not provided,
   in the view of the coolant space along the thickness direction, the cooling fin areas and the interval areas are arranged alternately along the flow direction to define columns and are arranged alternately along the width direction to define rows,
   downstream ends in the flow direction of the cooling fin areas in the rows contact upstream ends in the flow direction of the cooling fin areas in an immediately downstream row so that the cooling fin areas and the interval areas are arranged in a checkered pattern, and
   in each of the cooling fin areas, the cooling fins are arranged with at least some of the cooling fins non-parallel to others of the cooling fins in the cooling fin area to direct the coolant flowing in respective flow channels between the cooling fins to flow toward a center of the cooling fin area.

* * * * *